Aug. 28, 1962 J. T. MAUPIN 3,051,877

SEMICONDUCTOR DEVICES

Filed Dec. 29, 1955 2 Sheets-Sheet 1

INVENTOR.
JOSEPH T. MAUPIN

BY Orrin M. Haugen

ATTORNEY

INVENTOR.
JOESPH T. MAUPIN
BY Orvin M. Haugen
ATTORNEY

3,051,877
SEMICONDUCTOR DEVICES

Joseph T. Maupin, Deephaven, Minn., assignor to Minneapolis-Honeywell Regulator Company, Minneapolis, Minn., a corporation of Delaware
Filed Dec. 29, 1955, Ser. No. 556,210
1 Claim. (Cl. 317—235)

The present invention relates generally to an improved semiconductor electrical translating device such as for example, that which has become known in the art today as a transistor. More specifically, this invention relates to an improved junction type transistor having at least two junction zones and at least two low resistance electrodes making contact with said semiconductor body. More particularly, this invention relates to a specific type of tetrode semiconductor device having a pair of oppositely disposed junction zones and a pair of low resistance or ohmic contacts, and wherein the area between the junction zones is straddled by the ohmic contacts. In other words, in the improved device of the present invention the area between the junction electrodes has a low resistance electrode on either side thereof. In this type of device, there is contemplated a semiconductor body having one type of electrical conductivity and having diffused or alloyed thereinto an impurity material which, when diffused therein, renders the semiconducting body of substantially opposite conductivity. In this manner, as is conventional in the art, electrical junction zones are formed within the semiconductor body. As an example of the junction forming operation, an indium or p-type impurity member may be diffused or alloyed into an n-type germanium body to render the diffused area of p-type conductivity; thus forming a p-n electrical junction between the zones. The present invention is equally applicable to semiconductor substances other than germanium, such as silicon or the like, and is equally suited for use with various types of transistors such as p-n-p, n-p-n and the like.

In the production of semiconductor devices which are particularly designed to be capable of passing relatively large amounts of power, it is desirable that the area of the electrical junction be as large as possible in order to satisfactorily operate under relatively high power conditions. In addition, it is further desirable that the junction forming members be situated on oppositely disposed faces of the semiconductor body for the desired transistor type action. Normally in a transistor device of this sort, the "gain" of the amplifier diminishes substantially as the power output of the unit is increased. In this connection, attention is directed to FIGURE 6 of the drawings wherein a family of gain curves is plotted the normal gain characteristic being identified as $I_{b2-1}=0$. It is seen therefore that as the collector current is increased the gain of the unit falls rather rapidly. This decrease in gain is believed to be caused by the relatively intense transverse field set up in the base region between the emitter and collector electrodes, this field being necessarily set up as the base and collector currents increase. This field causes the emitter current density to be nonuniform such that the area closest to the base electrode conducts most of the current. Thus, as the device is called upon to accommodate a greater amount of power, the gain available from the unit decreases. The "gain" of a transistor semiconductor body may be defined mathematically as $$\frac{\alpha}{1-\alpha}$$

wherein $$\alpha=\frac{\delta I_c}{\delta I_e}(V_c=\text{constant})$$

In accordance with one modification of the present invention, a pair of low resistance electrodes are provided, and are mounted on opposite sides of the preferably annular emitter electrode. In operation, a bias is placed between the low resistance contacts, this bias being in opposition to the transverse field between the base and the emitter electrodes. This tends to diminish the field which otherwise exists between the emitter and base electrodes. In this manner it is believed that the efficiency of the junction electrode which is straddled by the pair of low resistance electrodes is increased due to the greater portion of the junction zone which is capable of emitting or injecting carriers into the semiconductor base substance. When the reverse bias is placed across the pair of low resistance electrodes, thereby forming a semiconductor tetrode, the gain which is available in the device is substantially flattened as shown by the various curves of FIGURE 6 of the drawings. It is desirable in devices of this sort that the pair of low resistance electrodes be separated by a continuous band of junction zone.

It is therefore an object of the present invention to provide a tetrode configuration for an alloyed type transistor amplifier.

It is a further object of the present invention to provide a transistor amplifier having tetrode configuration with a body being provided with two low resistance electrodes and a pair of junction electrodes which are situated on opposite surfaces of said body, and wherein the zone between the junction electrodes is substantially continuous and is straddled by the pair of low resistance electrodes.

It is a more specific object of the present invention to provide a transistor amplifier having a pair of alloyed junctions diffused thereinto, one of said alloyed junctions being straddled by a pair of relatively low resistance electrodes.

It is still a further object of the present invention to provide a transistor amplifier having gain characteristics which are controllable with respect to the amplitude of the collector current.

It is yet a further object of the present invention to provide a transistor tetrode having alloyed junction electrodes diffused thereinto which are substantially annular in configuration and having in addition a pair of low resistance electrodes which straddle one of said junction electrodes.

Other and further objects of the present invention will become apparent upon a study of the following specification taken in connection with the accompanying drawings wherein.

Figure 1:
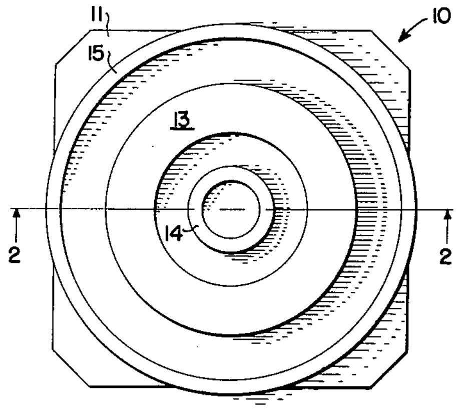
FIGURE 1 is a top plan view of a semiconductor amplifier fabricated in accordance with the present invention and showing a pair of low resistance electrodes straddling a junction electrode of annular configuration.
Figure 5:
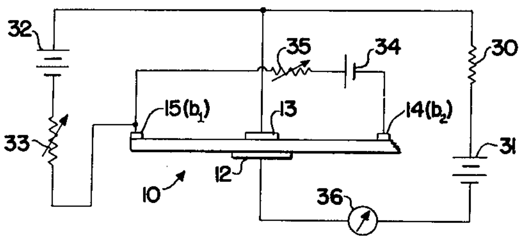
FIGURE 5 is a schematic drawing including a partial view of the device shown in FIGURES 1–2 on a somewhat modified scale illustrating a circuitry configuration for determining certain characteristics of the device of the present invention, these characteristics being plotted in FIGURE 6 below.
Figure 6:
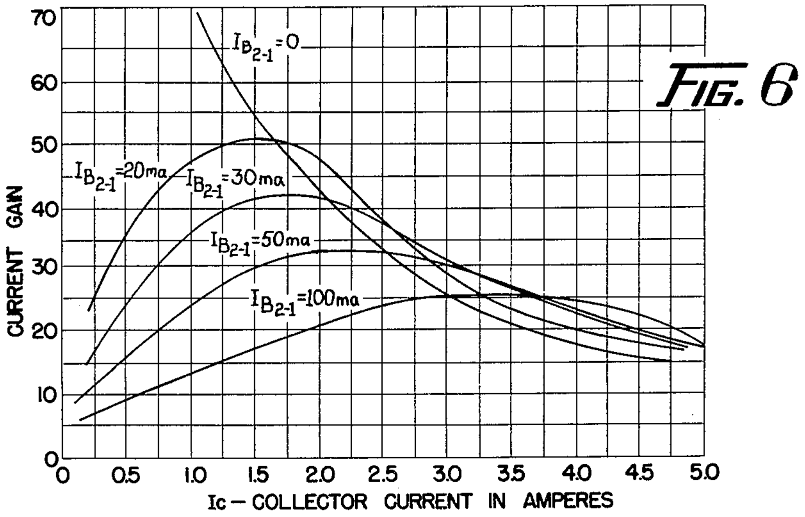
Figure 7:
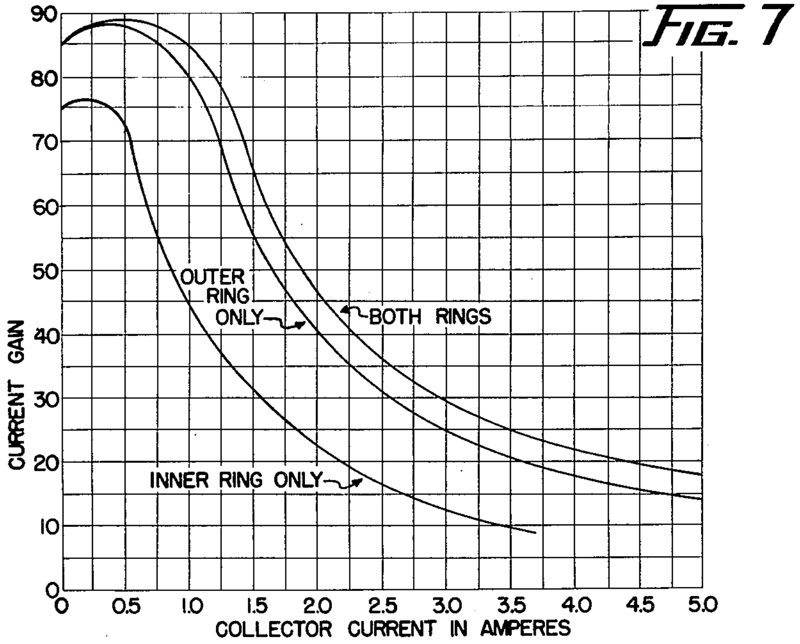

FIGURE 6 is a graph of the electrical characteristics of a device as shown in FIGURE 1 plotting the current gain, i.e., the ratio of the collector current to base current versus the collector current in amperes with a constant bias between the low resistance electrodes in accordance with the circuit schematically shown in FIGURE 5; and FIGURE 7 is a graph plotting the current gain versus collector current in amperes for a device in accordance with that shown in FIGURE 1, using as the base electrode in one instance the inner ring only, in another instance the outer ring only and in yet another instance using both rings connected as a unit as the base electrode.

Figure 2:
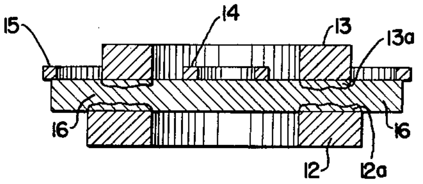
FIGURE 2 is a vertical sectional view of the device of FIGURE 1 taken along the lines and in the directions of the arrows 2—2 of FIGURE 1.

In accordance with the preferred modification of the present invention as illustrated in FIGURES 1 and 2 of the accompanying drawings, there is provided a semiconductor transistor amplifier of tetrode configuration generally designated 10. This device includes a semiconductor base member 11, a pair of oppositely disposed junction forming members 12 and 13, and a pair of base members 14 and 15 which make low resistance contact with the body 11. With the exception of the inner electrode 14, this device is fabricated in accordance with the disclosure of the copending application of George W. Rusler, Serial No. 454,244, filed September 7, 1954, entitled "Semiconductor Devices" and assigned to the same assignee as the present invention, and is now abandoned. In this connection the semiconductor block 11 may comprise, for example, highly purified germanium semiconductor material having n-type conductivity with a resistivity ranging from about 4 to 6 ohm centimeters. The junction electrodes 12 and 13 of course comprise an impurity which renders the conductivity of the germanium material substantially opposite to that of the remainder of the bulk material in the member 11 when alloyed or diffused thereinto. In this connection indium or other suitable acceptor type impurity material may be used when the body is doped with an *n* or donor type impurity. The low resistance base electrodes 14 and 15 may be made of any of the conventional materials such as nickel or the like, and may be either soldered thereto or diffused therein. It is desirable, however, that no electrical junction be formed between the block 11 and the low resistance base electrodes.

In fabricating the device of FIGURES 1 and 2, it is essential for proper operation of the device that the emitter ring or junction be substantially continuous along its entire extent. In other words, if the junction electrode 12 should have a discontinuous portion therein, the improvement which would otherwise be obtained by placing a bias on the base material surrounding the emitter will not be obtained. In other words, should a discontinuous segment result, the reverse bias field set up between the electrodes 14 and 15 will not pass uniformly through the relatively narrow zone or bridge 16 between the diffused portions **12*a* and 13*a*** but will instead have a much wider and more easily negotiated path along the discontinuous portion. In this event, the effect of the bias may be substantially lost.

Figure 3:
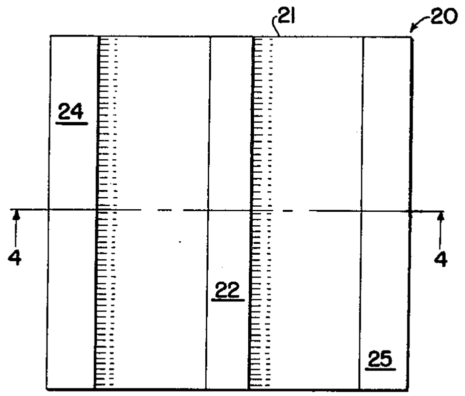
FIGURE 3 is a top plan view of a modified form of the present invention showing a somewhat different configuration of electrode members.
Figure 4:
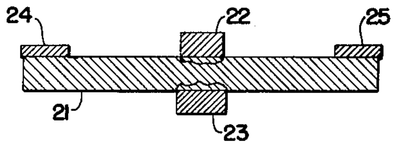
FIGURE 4 is a vertical sectional view of the device shown in FIGURE 3 taken along the lines and in the directions of the arrows 4—4 of FIGURE 3.

Attention is now directed to FIGURES 3 and 4 wherein there is shown a modified form of the present invention. For example, the semiconductor amplifier generally designated 20 includes a base material 21 having a pair of diffused junction impurity members 22 and 23 and a pair of low resistance base electrodes or contact members 24 and 25. The function of the electrodes in this case is the same as that for the modification shown in FIGURES 1 and 2, however, the design or geometric configuration is essentially different. In this device, a bias is placed across electrodes 24 and 25 in order to enhance and control the electrical characteristics of the device and particularly the efficiency of the emitter member 22. In this particular modification, it is desirable that the junction members 22 and 23 be continuous and extend substantially all of the way to the edge of the semiconductor body member 21 in order that an undesirable leakage path may be prevented between the low resistance electrodes 24 and 25 in which the path does not pass through the zone between the junction electrodes.

A specific example of preparation of a device in accordance with the present invention, with particular reference to FIGURES 1 and 2 follows. In this connection, a single crystal die or wafer of germanium having n-type conductivity characteristics and having a resistivity of between 4 and 6 ohm centimeters is prepared. This preparation is carried out in accordance with established and well-known crystal growing techniques. This die preferably has finished dimensions of 750 mils by 750 mils by 9.5 mils thick, and also has a pair of substantially parallelly disposed major faces. In this connection, I have found a thickness ranging from 9 to 10 mils to be satisfactory although a 9.5 mil thickness is preferred. The prepared semiconductor body is then etched with a suitable etching solution, such as for example, the etching solution as disclosed and set forth in Patent No. 2,619,414 to Heidenreich in order to clean the surface and improve the electrical properties thereof. An annular junction forming member shaped substantially as the member 12 as shown in FIGURE 1 is then prepared. For most purposes I prefer to use an electrode forming member having a composition of 95 percent indium and 5 percent germanium. Other suitable combinations of materials are set forth in the copending application of Van W. Bearinger, Serial No. 383,205, filed September 30, 1953, entitled "Semiconductor Devices," and assigned to the same assignee as the present invention, and now Patent No. 2,771,856. The annular collector junction electrode 12 has an outer diameter of 590 mils with a core of 410 mils diameter removed from the central portion thereof. Although other thicknesses are satisfactory, I prefer to use a toroidal blank having a thickness of about 30 mils which, among other things, is desirable for proper heat dissipation mounting. Suitable jigs are employed for controlling the diffusion of the impurity into the semiconductor body, thus maintaining the bodies in proper relative relationship. For accomplishing the proper diffusion cycle for alloying, I prefer to heat the previously arranged components to a temperature of about 1025° F., maintain that temperature for a period of about one minute, and thence cool rapidly to a temperature of approximately 850° F., at which point the rate of cooling is diminished, the unit then being cooled at a rate of approximately 80° F. per minute until cooled to substantially room temperature. After complete cooling, the other junction electrode is prepared and diffused into the opposite surface of the semiconductor body. In this connection, both electrodes are prepared in substantially the same manner, however, the emitter electrode 13 is preferably slightly smaller in area and having an outer diameter of about 570 mils and having a central core of about 430 mils diameter removed therefrom. After completion of the formation of the junction electrodes, the base electrode 15 is soldered to the outer peripheral regions of the semiconductor body. This electrode preferably is made of nickel or similarly conductive material, and is shaped as a circular ring. This ring has a width of about 30 mils and is substantially inscribed within the edges of the semiconductor body. This electrode may be attached to the semiconductor body with ordinary lead-tin-cadmium solder containing 18 percent cadmium with the remainder being conventional 60–40 lead-tin mixture. Following the preparation of the outer electrode, the inner base electrode member such as, for example, the member 14 in FIGURES 1 and 2 is prepared and attached in the same manner as was the outer electrode 15. Although the circular ring form is preferred, a disc-like configuration could be used satisfactorily. The inner electrode 14 has an outer diameter of 350 mils and is thus separated from an inner periphery of the junction member 13 by a distance of about 40 mils. After the appropriate lead wires have been attached and after a final etch in the above described etching solution the transistor device is ready for encapsulation in any appropriate type of unit or container. The unit is, of course, ready for operation following encapsulation.

Attention is directed to the circuit modification illustrated in FIGURE 5 along with the graph of FIGURE 6 which illustrates the characteristics of a tetrode transistor prepared in accordance with the present invention and placed in operation in a test circuit such as is illustrated in FIGURE 5. Here there is shown a partial view of the tetrode device of FIGURES 1 and 2. Base members 15 and 14 are also designated B1 and B2 respectively for easier comprehension of the graph of FIGURE 6. A load resistor 30 is provided in the output circuit of the transistor and the output of the unit is powered by a suitable source of energy such as battery 31. A source of signal potential which may be shown in the form of a battery 32 and a variable resistor 33 is provided as a biasing source for obtaining the desired emitter-base biasing voltage. A third source of energy may likewise be provided in the form of a battery as shown at 34, this source of energy being utilized to set up a transverse bias between the two base electrodes 14 and 15. The magnitude of the transverse bias current is controlled by the variable resistor 35. The current flowing in the collector circuit may be measured by the meter 36 and is designated $I_c$, and the transverse current flowing between the bases is designated $I_{b2}$. The static operating characteristics which illustrate the gain of the transistor unit are illustrated graphically in FIGURE 6. The values of the transverse bias field are plotted from zero through 100 milliamperes at various intervals and the trend established by these varying bias values is clearly shown in the plot. Although there is some sacrifice of the high gain at low collector current values, the overall gain characteristic is made substantially uniform and these features are considered highly desirable in various types of circuitry applications.

Attention is now directed to FIGURE 7 wherein there is illustrated the gain characteristics of a transistor prepared in accordance with the modification of the present invention as illustrated in FIGURE 1, however the device is being operated as a conventional triode. The curves are individually labeled wherein they represent the gain characteristics versus collector current in amperes for a series of tests wherein the inner ring is connected as the only base electrode, the outer ring is connected as the base electrode, or both rings are connected in parallel as a single base electrode unit. It is seen, therefore, that with both rings connected as a single unit the gain characteristics are better than those of the unit where only one or the other of the rings is used individually.

Other circuitry modifications are possible with the device of the present invention, such as, for example, a unipolar transistor. Should the device be desired to be utilized as a unipolar transistor the inner and outer base electrodes may be utilized as the conventional source and drain electrodes respectively while the junction members may be utilized together as the conventional gate electrode. In this connection, efficient use of the relatively expensive germanium crystal is obtained since the maximum area of electrodes is possible in accordance with the improved configuration of the present invention.

Although various modifications of the present invention have been disclosed herein, it will be understood that these are for purposes of illustration only and are not to be construed as a limitation upon the scope of the present invention. Many details of composition, procedure, and configuration may be varied without departing from the principles of this invention. It is therefore not my purpose to limit the patent granted on this application otherwise than necessitated by the scope of the appended claim.

I claim as my invention:

A circuit element comprising a thin semiconductor body having opposite major faces, an annular emitter electrode making elongated rectifying junction contact with one of the major faces of the semiconductor body, base electrode elements making ohmic contact with said major face of the semiconductor body on opposite sides of the emitter electrode in closely spaced relation to the emitter electrode, at least the outer one of said base electrode elements being in the form of an annular ring making elongated ohmic contact with said major face of the semiconductor body substantially parallel to the emitter electrode, and an annular collector electrode making rectifying junction contact with the opposite major face of the semiconductor body directly opposite said annular emitter electrode, the radial thickness of the annulus of the emitter electrode being approximately three-fourths that of the collector electrode.

References Cited in the file of this patent

UNITED STATES PATENTS

| | | |
|---|---|---|
| 2,754,431 | Johnson | July 10, 1956 |
| 2,754,455 | Pankove | July 10, 1956 |

FOREIGN PATENTS

| | | |
|---|---|---|
| 1,109,408 | France | Sept. 28, 1955 |
| 738,216 | Great Britain | Oct. 12, 1955 |